United States Patent
Rozenblit et al.

(10) Patent No.: US 6,466,772 B1
(45) Date of Patent: Oct. 15, 2002

(54) APPARATUS AND METHOD FOR IMPROVING POWER CONTROL LOOP LINEARITY

(75) Inventors: Dmitriy Rozenblit, Irvine; William J. Domino, Yorba Linda; Mark Oskowsky, Newport Coast, all of CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/161,014

(22) Filed: Sep. 25, 1998

(51) Int. Cl.[7] .............................. H04B 1/04; H03G 3/10
(52) U.S. Cl. ...................... 455/126; 455/69; 455/127; 330/136; 330/279
(58) Field of Search ................................ 455/126, 127, 455/522, 69, 117; 330/129, 136, 149, 278–285

(56) References Cited

U.S. PATENT DOCUMENTS

| | | | |
|---|---|---|---|
| 4,523,155 A | | 6/1985 | Walczak et al. |
| 4,709,403 A | * | 11/1987 | Kikuchi ....................... 455/126 |
| 4,864,251 A | * | 9/1989 | Baur ........................... 330/285 |
| 5,060,294 A | * | 10/1991 | Schwent et al. ............. 455/127 |
| 5,121,081 A | * | 6/1992 | Hori ............................. 455/126 |
| 5,126,686 A | * | 6/1992 | Tam ............................. 330/134 |
| 5,126,688 A | | 6/1992 | Nakanishi et al. |
| 5,179,353 A | * | 1/1993 | Miyake ....................... 330/129 |
| 5,214,393 A | * | 5/1993 | Aihara ........................ 330/279 |
| 5,252,929 A | * | 10/1993 | Taroumaru .................. 330/129 |
| 5,278,994 A | * | 1/1994 | Black et al. ................. 455/126 |
| 5,376,895 A | * | 12/1994 | Aihara ........................ 330/129 |
| 5,392,463 A | * | 2/1995 | Yamada ........................ 455/93 |
| 5,493,255 A | * | 2/1996 | Murtojarvi .................. 330/296 |
| 5,589,796 A | * | 12/1996 | Alberth, Jr. et al. ......... 330/133 |
| 5,635,870 A | | 6/1997 | Michael |
| 5,712,593 A | * | 1/1998 | Buer et al. .................. 330/129 |
| 5,977,833 A | | 11/1999 | Attimont |
| 6,002,300 A | * | 12/1999 | Herbster et al. ............. 330/149 |

FOREIGN PATENT DOCUMENTS

| | | |
|---|---|---|
| EP | 0 626 765 A1 | 11/1994 |
| EP | 0 717 492 A1 | 6/1996 |
| EP | 0 851 577 A1 | 7/1998 |

* cited by examiner

*Primary Examiner*—Vivian Chin
*Assistant Examiner*—Duc Nguyen
(74) *Attorney, Agent, or Firm*—Howrey Simon Arnold & White, LLP

(57) ABSTRACT

A closed loop power amplifier control system is provided. A self-adapting driver circuit is used to drive the power amplifier in accordance with the feed back error signal. The driver circuit compensates for non-linearities of the power amplifier.

30 Claims, 10 Drawing Sheets

APPARATUS AND METHOD FOR IMPROVING POWER CONTROL LOOP LINEARITY

BACKGROUND OF THE INVENTION

1. Field of the Invention

The invention relates generally to closed loop power control systems, and more particularly to closed loop power control systems for use in wireless applications such as cell phone technology.

2. Related Art

Closed loop feed back power control loops are commonly used in a number of contemporary applications, including, for example, wireless communication systems. In such systems, a power amplifier amplifies a modulated signal to be transmitted at a desired level such that the radiated power of the transmitted signal from the system's antenna is of sufficient strength to fall within the dynamic range of the intended receiver.

In many applications, closed loop systems are used to control radiated power to within a relatively narrow range. For example, the GSM transmission protocol requires that transmitted RF power be regulated within +/−2 dB of a nominal value. Closed loop systems typically accomplish this goal through the use of a feed back loop. Such feed back systems can include, for example, a power detector associated with a coupler at or near the antenna to detect the actual transmitted power level.

Power detection/monitoring may be accomplished with a logarithmic detector system. The detected power level can be compared with a desired power level to determine a difference between actual and desired power levels. This difference signal is processed in some manner and used to generate a feed back signal to the power amplifier to control the output level.

One drawback of contemporary closed-loop systems is that the power amplifier typically has a characteristic or response curve having highly non-linear regions (e.g., in its saturation regions). As such, the response of the overall system, even with the feed back loop, is non-linear. This can result in less-than-desirable response characteristics of the entire system. For example, if the loop is operating in a region where there is too little gain, loop response may be slower than desired. If on the other hand, the loop is operating in a region where there is too much gain, the system may go into oscillation.

In a GSM system, slow loop response due to non-linear responsiveness of the power amplifier can be quite troublesome because, to meet protocol requirements, the transmitted signal power must be able to go from start-up power to full power (e.g., from near 0 watts to 2 watts) in less than 28 microseconds.

Accordingly, an object of the subject invention is a power control closed-loop system with improved linearity in relation to the prior art.

Another object is a power control closed-loop system which overcomes the disadvantages of the prior art.

Further objects of the subject invention include utilization or achievement of the foregoing objects, alone or in combination.

Additional objects and advantages are set forth in the description which follows or will be apparent to those of ordinary skill in the art.

SUMMARY OF THE INVENTION

The present invention provides a system and method for improving linearity in a closed loop power control system.

According to one embodiment of the invention, a feed back loop including a logarithmic detector and a bipolar power amplifier is provided. The power amplifier is driven by a driver circuit which compensates for non-linearities in the system.

In one application, a self-adapting driver circuit is used to correct for non-linearities in a closed loop power amplifier system.

Specifically, in one embodiment, a supplemental current supply circuit is connected in series between the comparator and power amplifier of a closed loop power amplifier system. The supplemental current supply circuit senses when power amplifier is saturating and supplies extra current to roughly linearize the gain of the system.

According to one aspect of the invention, the closed loop power control amplifier system can be implemented in a wireless communication system such as, for example, GSM. Specifically, a closed loop power control amplifier system is provided comprising: a power amplifier configured to amplify a signal for transmission by an antenna over a communications channel; a power level sensor configured to sense the power level supplied to the antenna and generate a first signal in response thereto; a comparator configured to compare the first signal and a desired output power level and to provide a difference signal indicating the difference between the two; a power amplifier driver circuit for driving the power amplifier by a driving signal in accordance with the difference signal, wherein the power amplifier driver circuit senses when the power amplifier operates in a non-linear region and boosts the driving signal to correct for the non-linearity of the power amplifier.

Further features and advantages of the invention as well as the structure and operation of various embodiments of the invention are described in detail below with reference to the accompanying drawings.

BRIEF DESCRIPTION OF THE DRAWINGS

The present invention is described with reference to the accompanying drawings.

DETAILED DESCRIPTION OF THE INVENTION

1. Overview of the Invention

The present invention is directed to an apparatus and method for improving power control loop linearity in a variety of applications. According to one embodiment of the invention, at least one self-adapting driver circuit is connected to a power amplifier control input of a power amplifier to compensate for non-linearities in power amplifier operation.

2. Example Environment

Figure 1A:
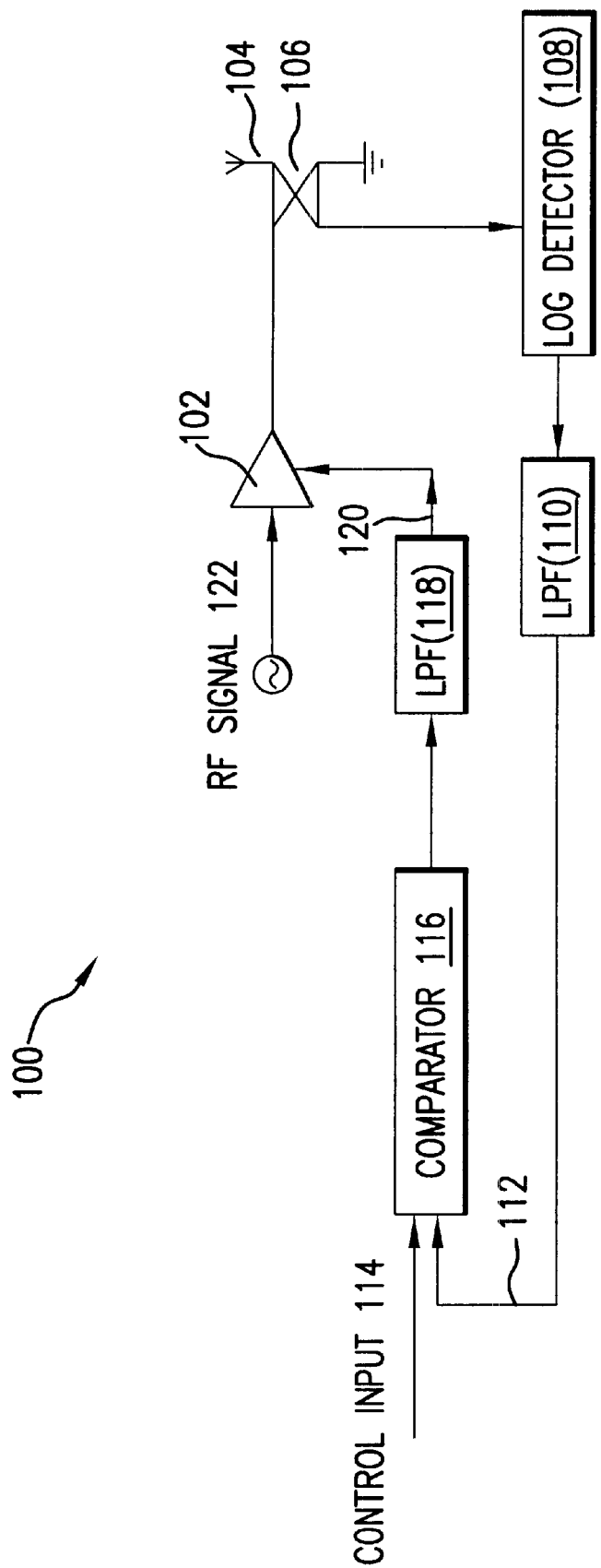
FIG. 1A is a block diagram illustrating an example environment of a communications system having a closed loop feed back system.

Before describing the invention in detail, it is useful to describe an example environment in which the invention can be implemented. Although the invention can be utilized in a number of applications, one example environment in which the invention can be implemented is an environment wherein a closed-loop feed back system to control transmitted power includes a bi-polar power amplifier circuit and a logarithmic detector. FIG. 1A is a block diagram illustrating the example environment of a closed-loop feed back system 100 to control the output power of a power amplifier 102. Referring now to FIG. 1A, the example environment includes a power amplifier 102, a comparator 116, an antenna 104, a power sensing system comprising a coupler 106 and log detector 108, and two low pass filters 110 and 118. In operation, power amplifier 102 receives a signal 122 to be transmitted via antenna 104. Power amplifier 102 amplifies signal 122 such that the radiated power is sufficient to travel across the communications channel (for example, the air) and be received by the designated receiver or receivers at a signal strength that is within the dynamic range of those receivers.

Because the characteristics of the communications channel and the designated receivers are known, it is possible to specify an output power level, or range of power levels, desired for communications. To ensure that power amplifier 102 is operating in the appropriate range, or at the appropriate power level, the closed-loop system utilizes log detector 108, via coupler 106, to detect the output power from antenna 112. The sensed power level 112, after filtering, is compared with a signal 114 indicative of a desired power level by comparator 116. The comparator generates a difference signal which is filtered to provide signal 120. Signal 120 is input to the power amplifier 102 to adjust the power output of power amplifier 102. In short, differences between the desired and actual output power are determined, and are fed back to the power amplifier to adjust its final output power.

Figure 2A:
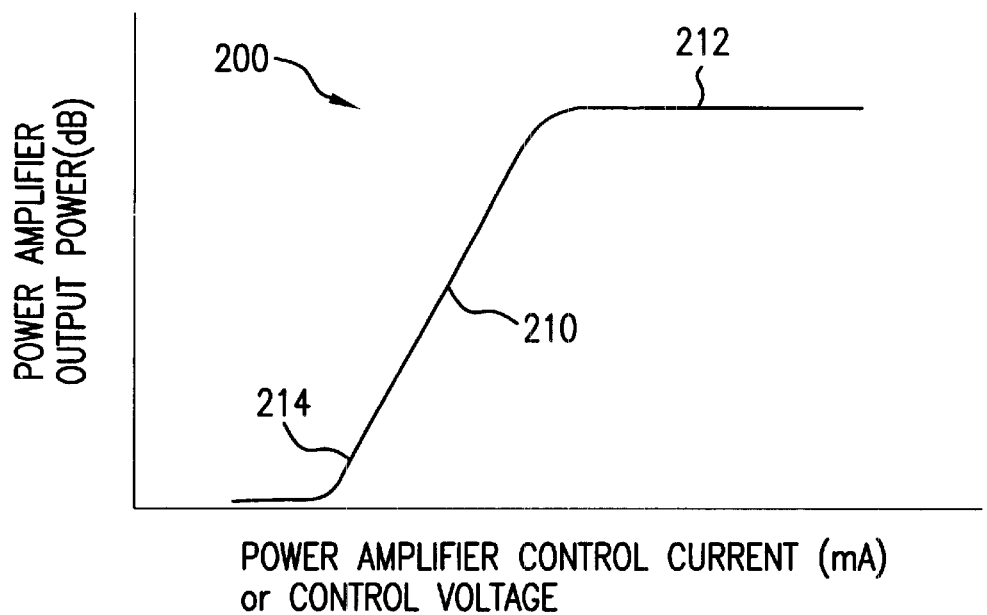
FIG. 2A is a diagram illustrating an example characteristic curve for the system illustrated in Figure 1A.

One disadvantage of such a closed-loop system is that power amplifier 102 typically exhibits non-linear characteristics. For example, a power amplifier 102 can have a region of its operating range that is nearly linear, and another region that is highly non-linear. An example characteristic curve is illustrated in FIG. 2A. The characteristic curve illustrated in FIG. 2A is a plot of the output power of power amplifier 102 versus the signal 120 indicative of the desired power level (e.g., the power amplifier control current or control voltage). As illustrated in the example of FIG. 2A, the characteristic curve 200 has a linear region 210 in which an increase in the desired output power is matched by a proportional, or roughly proportional, increase in the actual output power. However, above a given output power level, the power amplifier behaves non-linearly, as illustrated by non-linear region 212. Similarly, below a given output power level, the power amplifier behaves non-linearly, as illustrated by non-linear region 214. This example characteristic curve is provided for illustrative purposes only, and it should be appreciated by one of ordinary skill in the art that power amplifiers can behave according to alternative characteristic curves, in which some or all of the operating range is non-linear.

Figure 2B:
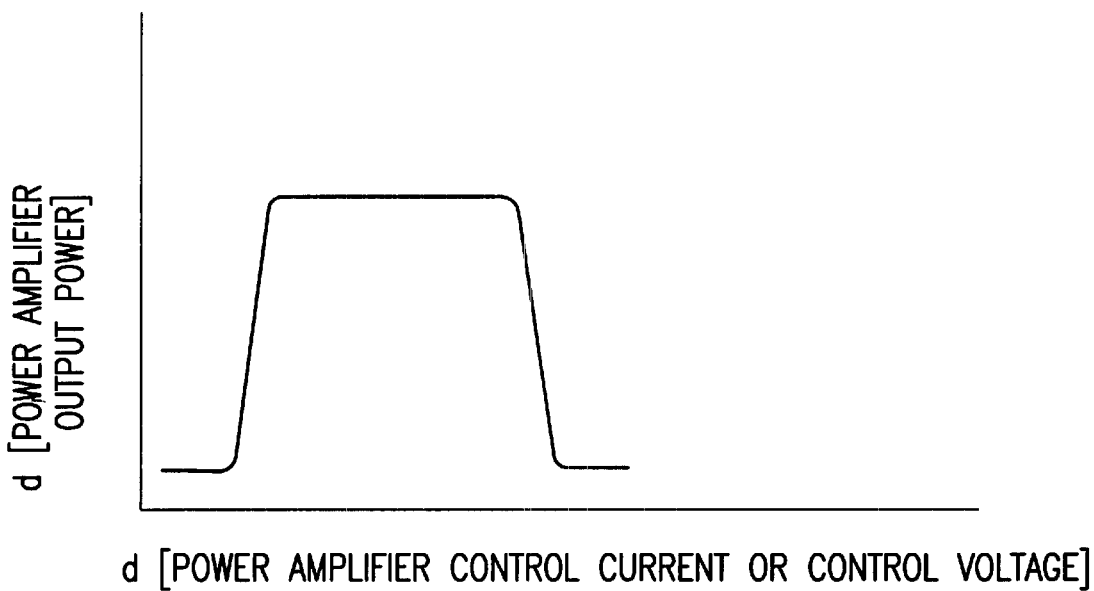
FIG. 2B is a diagram illustrating the first derivative of the characteristic curve shown in FIG. 2A.

As a result of the non-linear characteristic curve, the variation in the gain of the power amplifier across its operating range is dramatic. This is best appreciated by reference to FIG. 2B, which illustrates the first derivative of the characteristic curve of FIG. 2A. As shown, the variation in the gain of the power amplifier may be as great as 200:1.

To avoid the above problems, a fixed correcting means can be used to compensate for the non-linearities of the power amplifier. One example of such an arrangement is shown in FIG. 1B.

Figure 1B:
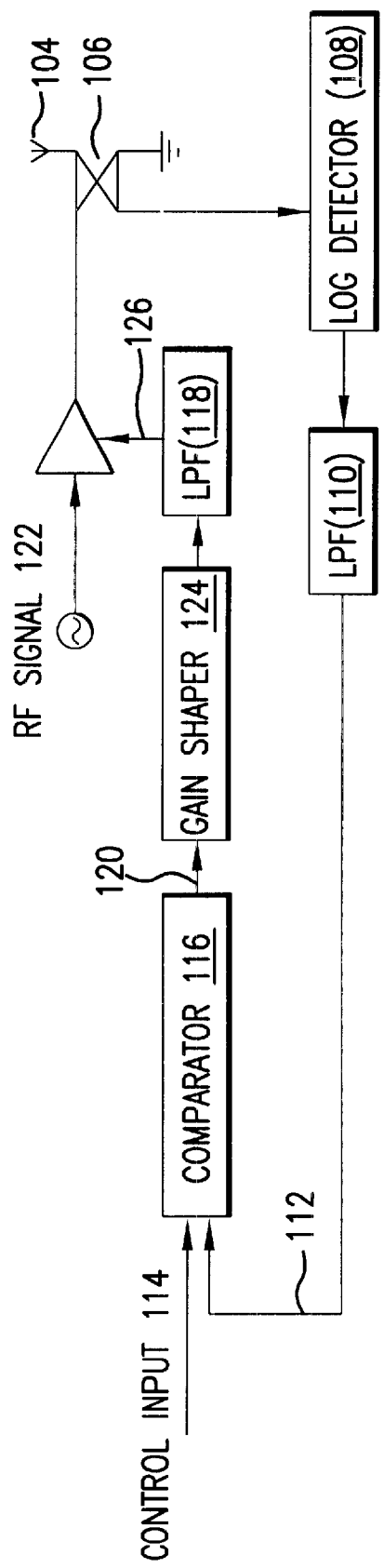
FIG. 1B is a block diagram illustrating an example environment of a communications system having a closed loop feed back system including a gain shaper.
Figure 2C:
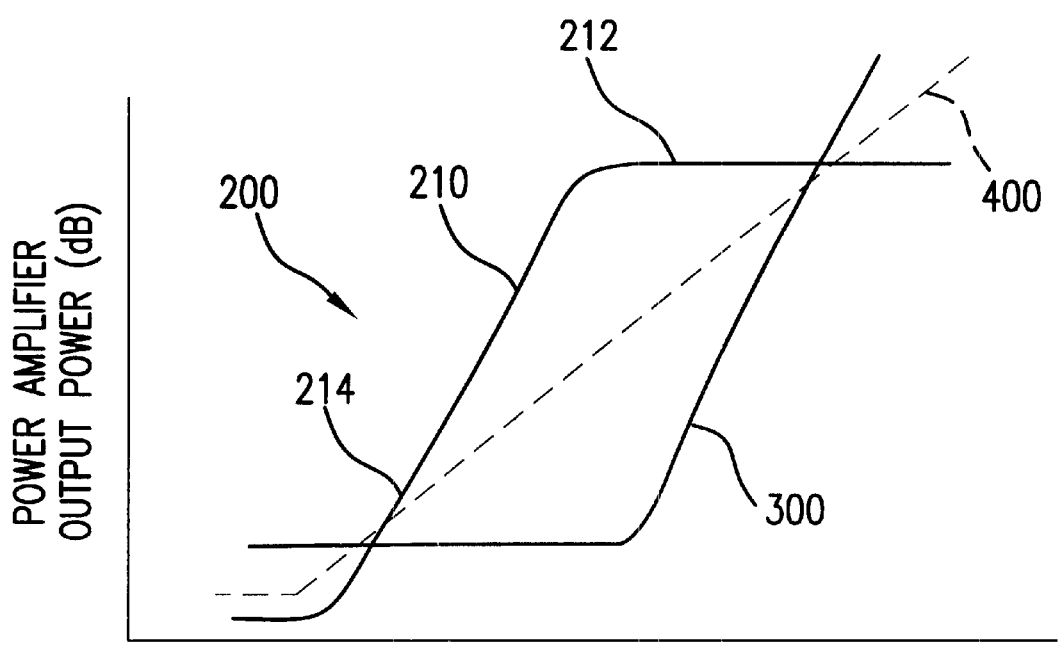
FIG. 2C is a diagram illustrating example characteristic curves for the power amplifier and gain shaper of FIG. 1B, and the resultant additive curve.

FIG. 1B is similar to FIG. 1A, except that it further comprises a gain shaper 124. Gain shaper 124 is designed to have a characteristic curve roughly reciprocal to that of the power amplifier (See, e.g., line 300 in FIG. 2C). Ideally, characteristic curves 200 and 300 would add to produce a roughly linear compensation line 400. However, this approach has several drawbacks.

First, there is a high likelihood of overcompensating the system by attempting to too closely match the gain to the power amplifier's shaper curve and going too far. This could create too great a gain in the power amplifier, resulting in oscillation of the system. Systems using the gain shaper approach generally do not attempt to completely eliminate gain variation, only reduce it such as from 200:1 to about 5:1.

Second, designing the reciprocal curve for the shaper is complicated by the fact that the characteristic curve of the power amplifier itself varies dynamically during operation. This is a result of a number of factors, including the following:

1. The base voltage of each power amplifier transistor, at constant base current, will vary approximately 2.2 mV/° K. A telecommunications device, for example, may have an operating temperature range of about ±45° C., which would result in base voltage variation of about ±100 mV.
2. The power amplifier base voltage may also vary as a function of input RF power due to a self-bias effect.
3. The input resistance of the power amplifier control input varies as a function of base current (or output power). This results in a variable pole in the loop response.
4. The input resistance of power amplifier's control line will dictate the position of a low pass pole in the system, which directly affects the loop band width stability of the system.
5. The input resistance of the control input of the power amplifier dynamically varies from an extremely high value (i.e., ideally infinite) in the OFF state to about 20Ω at full operation.
6. In manufacture, the characteristic curve of the power amplifier may vary somewhat from device to device due to part tolerances, etc. As a general matter, the shaper characteristic curve is not separately designed for each device, due to economic constraints. Simply put, it is too expensive to redesign the shaper for each separate circuit.

These factors, taken together, demonstrate that the exact characteristic curve of the power amplifier cannot be readily predicted for all operating conditions.

The above examples are being provided for the sole purpose of describing and contrasting with the subject invention and certain of its various embodiments, and their inclusion is without admission of prior art effect. After reading this description, it should be apparent to one of ordinary skill in the art that the invention can be practiced in environments and applications other than those contemplated by the foregoing examples.

3. Embodiments of the Invention

Figure 3:
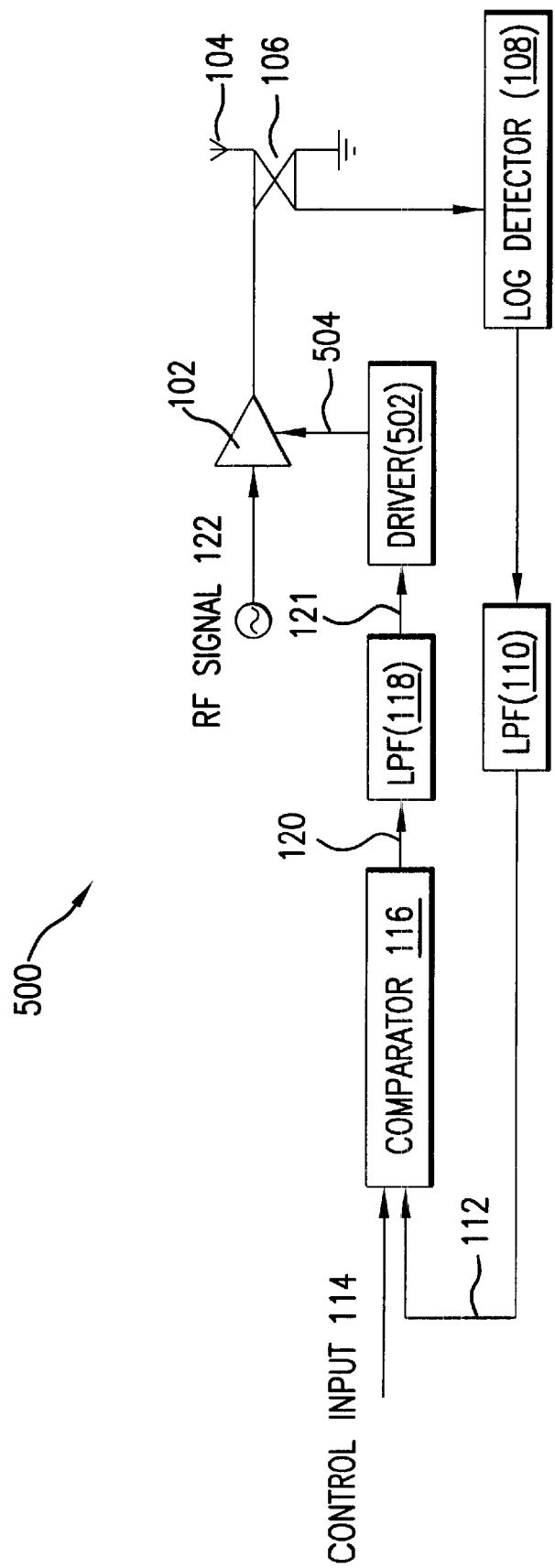
FIG. 3 is a block diagram illustrating a closed loop feed back power control system according to one embodiment of the invention.

A block diagram of one embodiment of the present invention is illustrated in FIG. 3. The closed loop system 500 includes a power amplifier 102, a comparator 116, a driver circuit 502, an antenna 104, a power sensing system comprising a coupler 106 and log detector 108, and two low pass filters 110 and 118. In operation, power amplifier 102 receives a signal 122 to be transmitted via antenna 104. Power amplifier 102 amplifies signal 122 such that the radiated power is sufficient to travel across the communications channel (for example, the air) and be received by the designated receiver or receivers at a signal strength that is within the dynamic range of those receivers.

Because the characteristics of the communications channel and the designated receivers are known, it is possible to specify an output power level, or range of power levels, desired for communications. The desired power level is presented to the system as control input 114. In one embodiment, described herein, the control input 114 is a current control signal, but it should be appreciated by those of ordinary skill in the art that a voltage control signal may be used. To ensure that power amplifier 102 is operating in the appropriate range, or at the appropriate power level, the closed-loop system utilizes log detector 108, via coupler 106, to detect the output power from antenna 104. The sensed power level is filtered by low pass filter 110. The filtered signal 112 is compared with control input signal 114 by comparator 116. The difference signal 120 generated by comparator 116 is filtered by low pass filter 118 to provide signal 121. The signal 121 is input to the driver circuit 502, and driver circuit 502, in turn, provides a compensated power control feed back signal 504 to bipolar power amplifier 102 to adjust the power output of power amplifier 102. In short, differences between the desired and actual output power are sensed, and are fed back to the power amplifier to adjust its final output power.

Driver circuit 502, as more fully discussed below, adaptively modifies the difference signal 121 to compensate for the non-linear characteristic curve of power amplifier 102, and generate the compensated power control feed back signal 504. In short, the function of driver circuit 502 is to dynamically sense when the power amplifier is entering a non-linear operating range and compensate the feed back signal 504 to minimize the detrimental effect of the gain variation of the system.

Figure 4:
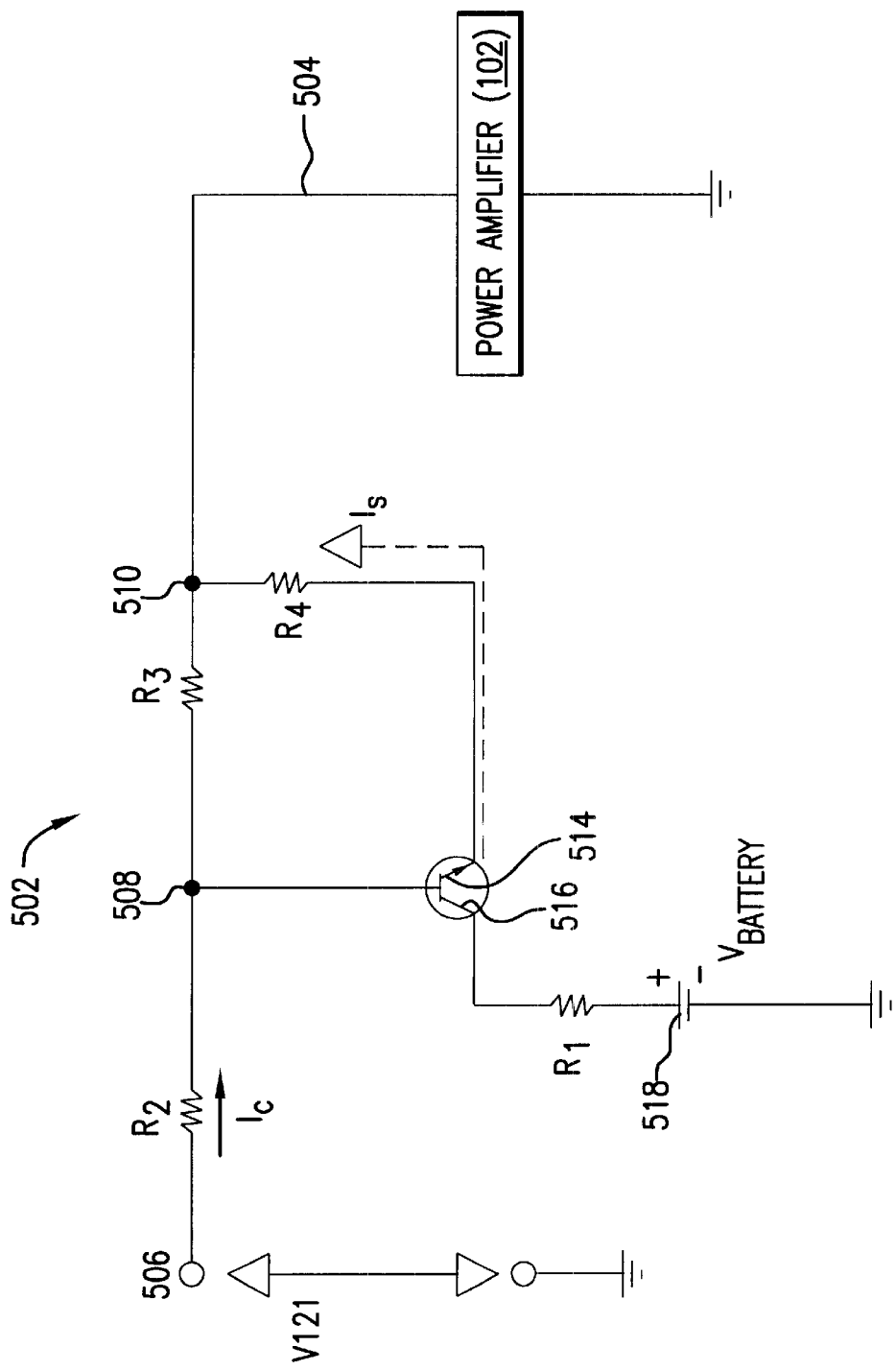
FIG. 4 is a circuit diagram of a power amplifier driver according to one embodiment of the invention.

FIG. 4 illustrates an exemplary embodiment of the driver circuit 502 according to the invention. The circuit has an input node 506 for receiving the difference signal 121. The difference signal 121 is generally a voltage signal. Therefore, a voltage to current converter (resistor R2) is used to convert signal 120 to a current $I_c$. Another resistor R3 is connected in series with R2 at junction node 508. The other end of R3 is connected to an output node 510. The control input of power amplifier 102 is also connected to node 510. A bipolar transistor Q1 has its base 512 connected to node 508. The emitter 514 of transistor Q1 is connected, via resistor R4, to output node 510, and the collector 516 of the transistor Q1 is connected, via resistor R1, to a supplemental power source 518. In a wireless communication apparatus, such as a cell phone handset, supplemental power source 518 may be the battery of the handset.

In this example, Q1 is a npn transistor, but it should be appreciated that other embodiments are possible in which Q1 is a pnp transistor or even a MOS transistor. In addition, it should further be appreciated that R1 serves to limit the current passed by transistor Q1 for device safety and can be avoided through suitable design of Q1.

As explained in relation to FIG. 2A, the power amplifer 102 has a characteristic curve having linear and non-linear regions. Generally speaking, this characteristic curve is similar to that of a diode, and thus for modeling purposes, the power amplifer 102 may be viewed as a diode with respect to the driver circuit 502. The operation of this example of the driver circuit 502 will now be described in detail.

In an initial state, it is assumed that transistor Q1 is OFF, that emitter 514 passes to node 510 negligible current from collector 516, and that the junction between collector 516 and emitter 514 is effectively an open circuit. Therefore, in this state, the voltage at node 514 will be approximately equal to the voltage at node 510, and output node 510 will only effectively receive current $I_c$. Thus, the current on signal line 504, the control current used to drive the control input of power amplifier 502, will be about $I_c$.

During operation, assuming that the desired output level of power amplifier 102 increases, the current $I_c$ passing to node 510 increases in proportion to the desired increase in the output level of the power amplifier 102. In the case in which the voltage drop across R3 is insufficient to turn on transistor Q1, it is assumed that the power amplifier is operating in a linear mode. However, in the case in which the voltage drop across R3 is sufficient to turn ON transistor Q1 and the emitter-collector path of transistor Q1 begins conducting, the power amplifier is assumed to be operating in or near a non-linear mode. Such will occur when the voltage drop across R3 equals or exceeds $V_{TH}$, the threshold voltage across the base-emitter junction of transistor Q1. Thus, the value of $I_c$, at which QI begins conducting is generally indicative of the transition between the linear and non-linear regions of Q1. Accordingly, the value of R3 should be chosen so that Q1 turns on at about the point of which power amplifier 102 becomes saturated and begins to operate in a non-linear mode of operation.

When Q1 turns on, a conducting path is formed between output node 510, and supplemental power supply 518 via resistors R1 and R4. As a result, supplemental current $I_s$ is supplied to output node 510. Accordingly, in this state, the control input 504 of power amplifier 102 receives current equal to $I_c+I_s$ (minus a small amount of current $I_c$ which may be drawn by the base 512 of transistor Q1). Thus, through suitable choice of the value of R3, transistor Q1 will turn on, and "boost" the current $I_c$ flowing to the control input 504 of the power amplifier just as the power amplifier is about to enter its non-linear region of operation.

Next, it is assumed that the desired output level of the power amplifier 102 is increased further. In this mode of operation, the voltage drop across resistor R3 increase further, and in turn, the transistor Q1 will be turned ON even more, thereby increasing the amount of current supply $I_s$. Thus, it should be appreciated that the driver circuit is self-adapting. That is, the more that power amplifier 102 goes into saturation, thereby demanding increasingly more current to achieve a certain increase in the output power level, the more transistor Q1 is turned ON thereby providing the necessary current.

Figure 5:
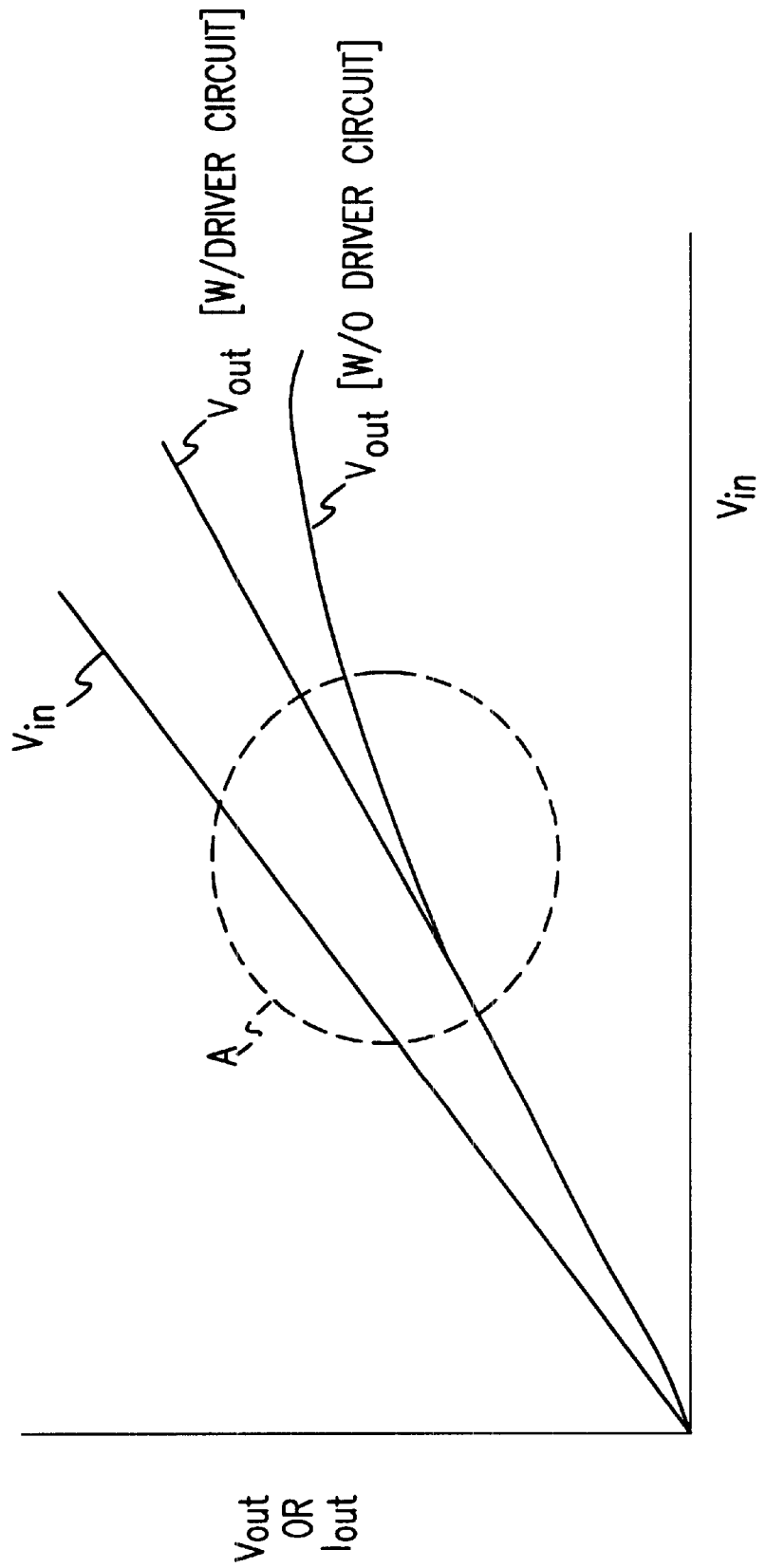
FIG. 5 is a diagram illustrating the characteristic curve for the power amplifier of FIG. 4.

As will be appreciated by those of ordinary skill in the art, the value of R3 determines at what point transistor Q1 will begin conducting. Thus, it should be selected so that supplemental current $I_s$ begins to be supplied roughly at the same point that power amplifier 102 enters its non-linear response region (See, line 212 in FIG. 2A). Referring to FIG. 5, this would correspond to area "A," the beginning of a noticeable compression in the power amplifier 102 characteristic curve, an area which is determinable for a given power amplifier design. Advantageously, the driver is designed so that transistor Q1 operates mostly in the linear range.

It should also be appreciated that the value of R4 determines the value of the supplemental current $I_s$ that will be provided as the power amplifier begins to operate in the non-linear region. It should be selected so that the gain experienced by the power amplifier in its non-linear region is roughly equal to the gain experienced by the power amplifier in its linear region.

Advantageously, transistor Q1 is fabricated in a manner similar to that used to fabricate the bipolar transistors which comprise power amplifier 102. As a result, temperature differences will equally affect both circuits and performance variations due to such differences will be negligible. Further, while transistor Q1 has been described as a bipolar transistor, it should be appreciated that FET's or other types of MOS switches or semiconductor devices could be used.

Figure 8:
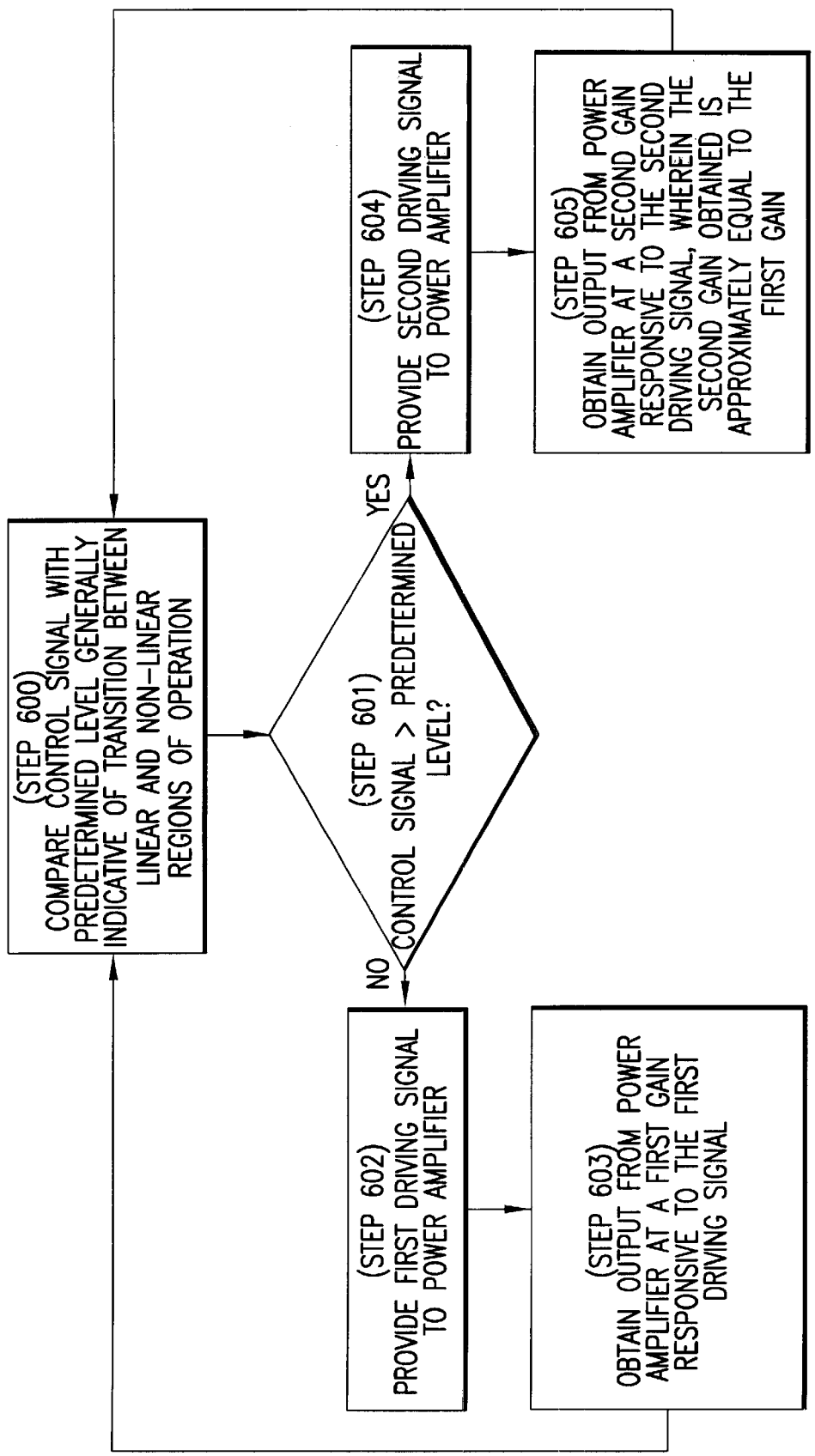
FIG. 8 is a flow chart depicting a method of operation of an embodiment of the subject invention.

With reference to FIG. 8, a method of operation of a driver device 502 will now be described. In step 600, a control signal is provided, e.g., $I_c$, and compared with a predetermined level generally indicative of a transition between a linear and a non-linear region of operation of the power amplifier. In the example of FIG. 4, the control signal is $I_c$, and the predetermined level indicative of a transition between a linear and non-linear region of operation is the level of current $I_c$ which is sufficient to turn R3 on.

In step 601, if the control signal is less than or equal to the predetermined level, a jump is made to step 602. In step 602, a first driving signal is provided to the power amplifier. In the example of FIG. 4, the first driving signal is the current $I_c$. In step 603, an output is obtained from the power amplifier responsive to the first driving signal provided to the amplifier in step 603. The output from the amplifier is provided at a first gain.

Turning back to step 601, if the control signal is greater than the predetermined level, a jump is made to step 604. In step 604, a second driving signal is provided to the power amplifier. In the example of FIG. 4, the second driving signal is $I_c+I_s$, a boosted form of the first driving signal $I_c$. In step 605, an output is obtained from the power amplifier responsive to the second driving signal provided to the amplifier in step 604. The output of the amplifier is provided at a second gain about equal to the first gain.

It should be appreciated that the design may be easily altered for different power amplifiers. To accommodate variations in the point at which the power amplifier enters into non-linear region (point A in FIG. 5), resistor R3 may be adjusted so that transistor Q1 turns on at the desired point. To accommodate variation in the gain experienced by the power amplifier in the linear region, resistor R4 may be adjusted so that the gain experienced in the non-linear region is about equal to the gain experienced in the linear region.

Figure 7:
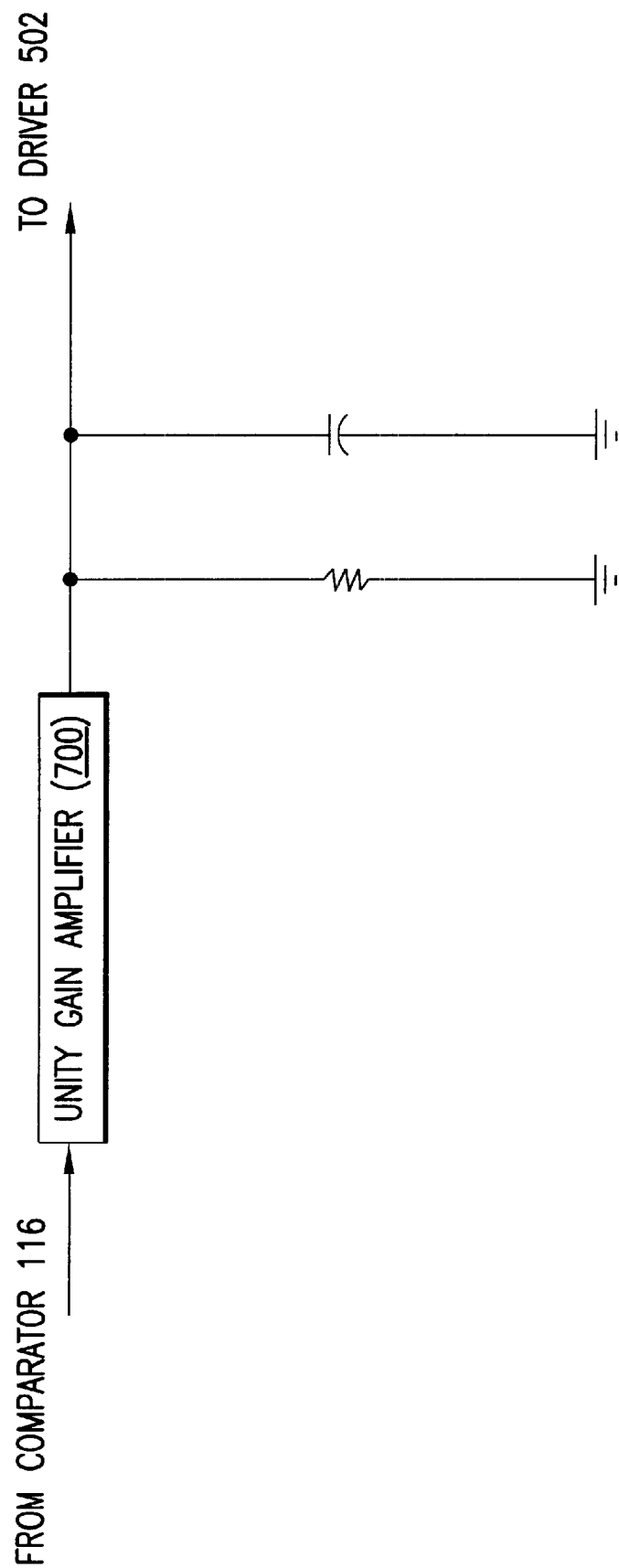
FIG. 7 is a circuit diagram of a low pass filter block used in an embodiment of the invention.

FIG. 7 illustrates an embodiment of low pass filter block 118. In this embodiment, a relatively low output impedance unity gain amplifier 700 is connected to the output of comparator 116. The output of amplifier 700 in turn is connected to a circuit comprising a resister and comparator coupled in parallel. This current introduces a single fixed pole in the control loop. However, this pole is not dependent on power amplifier operation and is thus easily accounted for in loop design.

Figure 6:
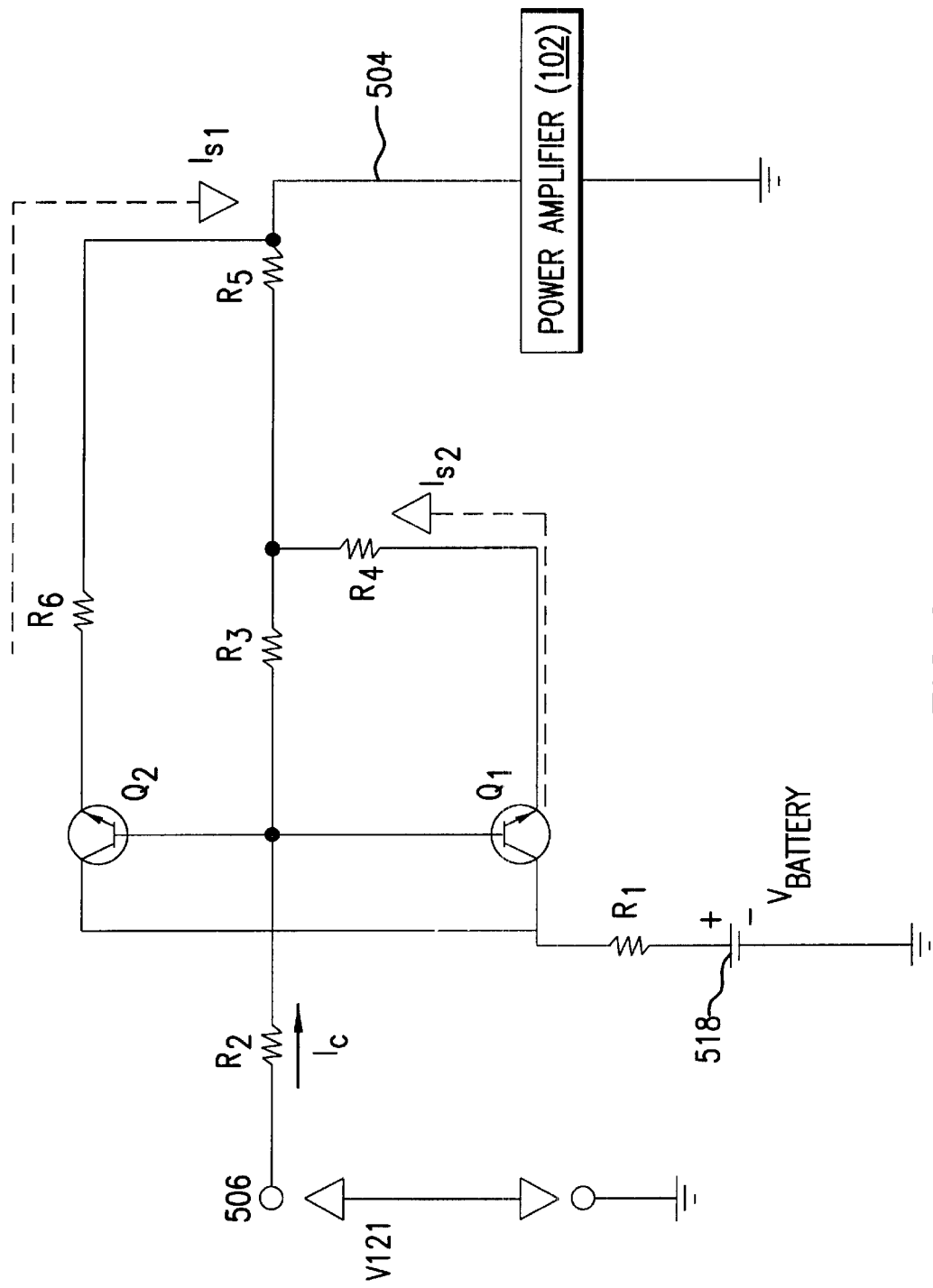
FIG. 6 is a circuit diagram of a power amplifier driver according to another embodiment of the invention.

FIG. 6 illustrates another embodiment of driver circuit 504. This embodiment is similar to the previous one but further includes a second transistor Q2 and additional resistors R5 and R6. This embodiment provides for two-stage linearization. Transistor Q1 will still turn ON when the voltage drop across resistor R3 reaches a first predetermined level. In addition, transistor Q2 will turn ON when the voltage drop across resistors R3 and R5 reaches a second predetermined level. Since this second predetermined level will be achieved before the first, transistor Q2 will turn ON earlier in the operation of power amplifier 102, and thereby begin supplying current $I_{s1}$ to the control input 504 of power amplifier 102. As the desired output of power amplifier 102 increases, Q1 is turned on thereby supplying current $I_{s2}$ to the control input 504. As a result, depending on the stage of operation, power amplifier 102 may receive three different sources of current: (1) $I_c$, (2) $I_c+I_{s1}$ or (3) $I_c+I_{s1}+I_{s2}$. As will be appreciated by those of ordinary skill in the art, further stages may be added to the driver circuit 504, thereby increasing the linearity of the closed loop system. Accordingly, another embodiment of the invention includes n transistors, each capable of supplying a current $I_{sn}$ to the power amplifier 102.

While the above embodiments have been described in reference to a current driven power amplifier, it will be appreciated that the system may be used in a voltage driven system, with the inclusion of appropriate current to voltage (or vice versa) converters.

Moreover, it will be appreciated that the present invention is well suited for use in a HBT (Heterojunction Bipolar Transistor) power amplifier system. Thus, in certain embodiments of the invention HBT transistors are used in the power amplifier.

EXAMPLE

In one implementation of the embodiment illustrated in FIG. 4, the following components were used:

R1: 18 ohms
R2: 51 ohms
R3: 390 ohms
R4: 8.2 ohms
Q1: 2N3904
Power Amplifier: Rockwell mass production item U701:RF130

4. Conclusion

As should be appreciated by one of ordinary skill in the art, real world operating conditions typically lead to situations in which systems, devices or components do not behave according to their ideal characteristics. As such, terms used in this document such as, for example, "linear", should not be construed narrowly as perfectly linear. Instead, such terms should be more broadly construed as not only encompassing the ideal condition of, for example, perfectly linear, but also the less-than-ideal condition of, for example, roughly linear. That is, the terms herein should be construed in accordance with their intended real world function. Thus a "linear" circuit need only be as linear as one of ordinary skill in the art would deem necessary to operate for its intended purpose.

While various embodiments of the present invention have been described above, it should be understood that they have been presented by way of example only, and not by way of limitation. Thus, the breadth and scope of the present invention should not be limited by any of the above-described exemplary embodiments, but should be defined only in accordance with the claims and their equivalents.

What is claimed is:

1. A wireless communication system, comprising:
   a power amplifier having linear and non-linear regions of operation configured to amplify a signal for transmission by an antenna over a communications channel;
   a power level sensor configured to sense the power level of the power amplifier output;
   a comparator configured to compare the power level sensed by said power level detector and a desired output power level and to provide a difference signal indicating the difference between the two; and
   a power amplifier driver circuit for driving the power amplifier by a driving signal in accordance with the difference signal, wherein the power amplifier driver circuit is configured to boost the driving signal when the power amplifier operates in the non-linear region, and to avoid boosting the driving signal, at least to the same degree, when the power amplifier operates in the linear region.

2. A wireless communication system, comprising:
   a power amplifier having a non-linear region of operation configured to amplify a signal for transmission by an antenna over a communications channel;
   a power level sensor configured to sense the power level of the power amplifier output;
   a comparator configured to compare the power level sensed by said power level sensor and a desired output power level and to provide a difference signal indicating the difference between the two; and
   a power amplifier driver circuit for driving the power amplifier by a driving signal in accordance with the difference signal, wherein the power amplifier driver circuit is configured to boost the driving signal when the power amplifier operates in the non-linear region; and the power amplifier driver circuit comprises:
   an input node for receiving the difference signal as a voltage;
   a first resistor connected between the input node and a junction node;
   a second resistor connected between the junction node and an output node for providing the driving signal to the power amplifier; and
   at least one transistor, having a base connected to the junction node, an emitter, and a collector, and having a first one of said emitter and collector coupled to the output node and a second one of said emitter and collector coupled to a power supply.

3. The wireless communication system of claim 2, wherein the first one of said emitter and collector is coupled to said output node through a third resistor.

4. A feed back loop system comprising a driver circuit for driving in a feed back loop a power amplifier with a driving signal determined responsive to a difference signal from a comparator, the driver circuit comprising:
   a first node for receiving the difference signal;
   a first resistor connected between the first node and an second node for providing the driving signal to the power amplifier; and
   at least one transistor, having a base connected to the first node, an emitter, and a collector, wherein a first one of said emitter and collector is coupled to the output node and a second one of said emitter and collector is coupled to a power supply.

5. The driver circuit of claim 4, wherein the first one of said emitter and collector is coupled to said output node through a second resistor, and the second one of said emitter and collector is coupled to said power supply through a third resistor.

6. A feed back loop system comprising a driver circuit for driving in a power amplifier with a driving signal determined responsive to a signal from a comparator, the driver circuit comprising:
   a node for receiving a control signal;
   means for supplying a first driving signal to the power amplifier when the control signal is less than a predetermined level generally indicative of a linear to non-linear transition point of the amplifier, the amplifier providing an output at a first gain responsive to the first driving signal; and
   means for applying a boost signal to the power amplifier when the control signal is greater than the predetermined level, the amplifier providing an output responsive to the second driving signal at a second gain, said boost signal gradually increasing as the amplifier operates more in the non-linear region.

7. A feed back loop system comprising driver circuit for driving a power amplifier with a driving signal determined responsive to a signal from a comparator, the driver circuit comprising:
   a node for receiving a control signal;
   means for supplying a first driving signal to the power amplifier when the control signal is less than a predetermined level generally indicative of a linear to non-linear transition point of the amplifier, the amplifier providing an output at a first gain responsive to the first driving signal; and
   means for applying a boost signal to the power amplifier when the control signal is greater than the predetermined level, the amplifier providing an output responsive to the second driving signal at a second gain, said boost signal gradually increasing as the amplifier operates more in the non-linear region, wherein the second gain is approximately equal to the first gain.

8. A method of operating a power amplifier responsive to an input control signal comprising the following steps:
   supplying a first driving signal to the power amplifier when the control signal is less than a predetermined level generally indicative of a linear to non-linear transition point of the amplifier;
   providing an output from the amplifier at a first gain responsive to the first driving signal;
   supplying a second driving signal to the power amplifier when the control signal is greater than the predetermined level; and
   providing an output from the amplifier at a second gain responsive to the second driving signal.

9. A method of operating a power amplifier responsive to an input control signal comprising the following steps:
   supplying a first driving signal to the power amplifier when the control signal is less than predetermined level generally indicative of a linear to non-linear transition point of the amplifier;
   providing an output from the amplifier at a first gain responsive to the first driving signal;

supplying a second driving signal to the power amplifier when the control signal is greater than the predetermined level; and providing an output from the amplifier at a second gain responsive to the second driving signal, wherein the second gain is approximately equal to the first gain.

10. A feed back loop system comprising:

a comparator;

a power amplifier; and a supplemental current supply circuit, connected in series with the comparator and power amplifier, which supplies boost current to the power amplifier to roughly linearize the gain of the power amplifier when sensing that the power amplifier is saturating, and avoids'supiplving boost current to the power amplifier. at least to the same degree, when sensing that the power amplifier is not saturating.

11. A system comprising:

a power amplifier having linear and non-linear regions of operation; and a driver circuit for driving the power amplifier with a driving signal determined responsive to a control signal, wherein the driver circuit is configured to boost the driving signal upon an indication from the control signal that the power amplifier has transitioned to the nonlinear region from the linear region, and to avoid boosting the driving signal, at least to the same degree, when the control signal indicates the power amplifier is operating in the linear region.

12. The system of claim 11 wherein the driver circuit is configured to continue boosting the driving signal while the control signal indicates that the power amplifier is operating in the non-linear region.

13. The system of claim 11 wherein the control signal is a difference signal representing a difference between detected and desired output power levels for the power amplifier.

14. The system of claim 13, wherein the detected output power level is detected by a detector circuit.

15. The system of claim 14, wherein the detector circuit is a log detector circuit.

16. The system of claim 11 wherein the driver circuit includes a transistor for boosting the driving signal which is fabricated similarly to the power amplifier.

17. The system of claim 11 wherein the indication the power amplifier has transitioned to the non-linear region is provided when the control signal exceeds a threshold.

18. The system of claim 17 further comprising a circuit for adjusting the threshold.

19. The system of claim 18 wherein the circuit for adjusting the threshold is a resistor.

20. The system of claim 11 further comprising a circuit for adjusting the level of boost provided to the driving signal upon the indication that the power amplifier has transitioned to the non-linear region of operation.

21. The system of claim 20 wherein the circuit for adjusting the level of boost is a resistor.

22. The system of claim 11 wherein the driver circuit is configured to boost the driving signal in n stages, wherein n is an integer of two or more.

23. A method of driving a power amplifier having linear and nonlinear regions of operation comprising the steps of:

providing a control signal;

driving the power amplifier with a driving signal determined responsive to the control signal;

boosting the driving signal upon an indication from the control signal that the power amplifier has transitioned to the non-linear region from the linear region; and avoiding boosting the driving signal, at least to the same degree, when the control signal indicates the power amplifier is operating in the linear region.

24. The method of claim 23 further comprising continuing to boost the driving signal while the control signal indicates that the power amplifier is operating in the non-linear region.

25. The method of claim 23 wherein the control signal is a difference signal representing a difference between detected and desired output power levels for the power amplifier.

26. The method of claim 23 further comprising indicating that the power amplifier has transitioned to the non-linear region when the control signal exceeds a threshold.

27. The method of claim 26 further comprising adjusting the threshold.

28. The method of claim 23 further comprising adjusting the level of boost provided to the driving signal upon the indication that the power amplifier has transitioned to the non-linear region of operation.

29. A system comprising:

power amplifier means for amplifying an input signal, the power amplifier means having linear and non-linear regions of operation; and driver means for driving the power amplifier means with a driving signal determined responsive to a control signal, for boosting the driving signal upon an indication from the control signal that the power amplifier means has transitioned to the non-linear region from the linear region, and for avoiding boosting the driving signal, at least to the same degree, when the control signal indicates the power amplifier means is operating in the linear region.

30. A method of driving a power amplifier having linear and nonlinear regions of operation comprising the steps of:

a step for providing a control signal;

a step for driving the power amplifier with a driving signal determined responsive to the control signal;

a step for boosting the driving signal upon an indication from the control signal that the power amplifier has transitioned to the non-linear region from the linear region; and a step for avoiding boosting the driving signal, at least to the same degree, when the control signal indicates the power amplifier is operating in the linear region.

* * * * *